United States Patent
Kawai et al.

[11] Patent Number: 5,981,972
[45] Date of Patent: Nov. 9, 1999

[54] ACTIVED MATRIX SUBSTRATE HAVING A TRANSISTOR WITH MULTI-LAYERED OHMIC CONTACT

[75] Inventors: Katsuhiro Kawai, Kashihara; Shinya Yamakawa, Ikoma; Satoshi Yabuta, Nara; Atsushi Ban, Soraku-gun, all of Japan

[73] Assignee: Sharp Kabushiki Kaisha, Osaka, Japan

[21] Appl. No.: 09/079,149

[22] Filed: May 15, 1998

[30] Foreign Application Priority Data

Jun. 23, 1997 [JP] Japan ..................... 9-166290

[51] Int. Cl.⁶ .................................. H01L 29/04
[52] U.S. Cl. .................. 257/59; 257/59; 257/72; 257/347; 257/349
[58] Field of Search ................... 257/59, 72, 349

[56] References Cited

U.S. PATENT DOCUMENTS 5,641,974  6/1997  Den Boer et al. .
5,714,407  2/1998  Maeno et al. ............... 438/228
5,818,076  10/1998  Zhang et al. ............... 257/255

FOREIGN PATENT DOCUMENTS

172685/1983  10/1983  Japan .
406077483  3/1994  Japan ....................... 257/59

OTHER PUBLICATIONS

U.S. Serial application No. 08/695,632 dated Aug. 12, 1996.

*Primary Examiner*—Fetsum Abraham
*Attorney, Agent, or Firm*—Nixon & Vanderhye

[57] ABSTRACT

An active matrix substrate of a Pixel on Passivation structure includes TFTs and pixel electrodes on an interlayer insulating film over bus lines. The interlayer insulating film is formed of an organic insulating film, and the contact layer of the TFT has a double layer structure of a fine crystal silicon ($n^+$) layer and an amorphous silicon ($n^+$) layer the crystal silicon ($n^+$) layer being placed on the side closer to the source electrode and the drain electrode, and the amorphous silicon ($n^+$) layer being placed on the opposite side. This improves both the ON characteristics and the OFF characteristics of the TFT are improved, and the stable operative region of the active matrix substrate and the margin to accommodate to variations in threshold value due to aging are expanded, without substantial additional production costs and a decrease in productivity.

5 Claims, 9 Drawing Sheets

ACTIVED MATRIX SUBSTRATE HAVING A TRANSISTOR WITH MULTI-LAYERED OHMIC CONTACT

FIELD OF THE INVENTION

The present invention relates to an active matrix substrate of a so-called Pixel on Passivation structure in which pixel electrodes are disposed in matrix form on an interlayer insulating film separating the pixel electrodes from thin film transistors as switching elements selectively applying drive voltage to the pixel electrodes and bus lines driving the thin film transistors.

BACKGROUND OF THE INVENTION

Conventionally, a liquid crystal display device forms a display pattern on a screen by driving pixel electrodes disposed in matrix form. Specifically, voltage is applied across selected pixel elements and opposite electrodes opposing the selected pixel elements to optically modulate the liquid crystal layer inserted between these two kinds of electrodes, and the optical modulation is viewed as a display pattern.

A popular method for driving pixels is active matrix driving method according to which independently disposed electrodes are connected to, and driven by, respective switching elements. Examples of switching elements include thin film transistors (TFTs), metal-insulator-metal (MIM) elements, MOS transistor elements, and diodes.

FIG. 5 shows an example of conventional active matrix substrates using TFTs as switching elements. FIG. 5 shows a structure of a pixel segment of an active matrix substrate.

The active matrix substrate has on an insulating substrate 41 scanning lines 42 disposed parallel to one another and signal lines 43 disposed crossing over the scanning lines 42 at right angles. The substrate 41 will be later described in detail (see FIG. 6).

Pixel electrodes 44 are disposed in the rectangular regions bordered by the scanning lines 42 and the signal lines 43. TFTs 45 are formed in proximity to the cross points of the scanning lines 42 and the signal lines 43. In addition, between neighboring pairs of the scanning lines 42 beneath the pixel electrodes 44 are formed supplemental capacitance (Cs) lines 46 disposed parallel to the scanning lines 42. The Cs lines 46 are provided commonly to all the pixels. A supplemental capacitance is formed where the pixel electrode 44 overlaps the Cs line 46 with a gate insulating film 52 therebetween.

A brief overview of a manufacturing process of such an active matrix substrate is given below with reference to FIG. 6 which is a cross-sectional view taken along line 6—6 in FIG. 5. First, the scanning lines 42, the Cs lines 46, and gate electrodes 51 for TFTs 45 are formed on the substrate 41 in a single process. Next, the gate insulating film 52 is formed to cover all these, and a semiconductor layer 53, an etching stopper layer 54, and a contact layer 55 are formed in this order on the gate insulating film 52.

Finally, a transparent conductive film T and a metal thin film M are formed thereon and patterned, so as to form source electrodes 56, the signal lines 43, drain electrodes 57, and the pixel electrodes 44, which complete the manufacture of the active matrix substrate. The source electrode 56, the signal line 43, and the drain electrode 57 are composed of two layers, i.e. the transparent conductive film T and the metal thin film M, whereas the pixel electrode 44 is composed of a single layer, i.e. the transparent conductive film T.

When such an active matrix substrate is applied to a liquid crystal display device, the opening of the liquid crystal display element is the combined areas of the pixel electrodes 44 less the pasting accuracy of the opposite substrate (not shown) with a black matrix of opposite substrate. The light transmitivity of the liquid crystal display element largely depends on the aperture ratio, and is one of the factors that determine the display quality of the liquid crystal display element.

Hence, various methods have been proposed to increase the aperture ratio, one of which is the so-called Pixel on Passivation structure in which pixel electrodes are disposed on an interlayer insulating film covering TFTs as active elements and bus lines (scanning lines and signal lines).

FIG. 7 shows an example of an active matrix substrate of this structure. FIG. 7 shows a structure of a pixel segment of an active matrix substrate. FIG. 8 is a cross-sectional view taken along line 8—8 in FIG. 7. FIG. 9 is a cross-sectional view taken along line 9—9 in FIG. 7.

As shown in FIG. 7, the active matrix substrate includes on the insulating substrate 41 scanning lines 42, signal lines 43, and Cs lines 46 similarly to the active matrix substrate in FIG. 5. TFTs 45 are also formed in the same manner as described above (FIG. 8), and have the same layer structure.

The difference lies in that an interlayer insulating film 58 is formed so as to cover the substrate 41 on which the TFTs 45 are already formed and that the pixel electrodes 44 are formed on the interlayer insulating film 58. As the pixel electrode 44 is disposed on the interlayer insulating film 58, the edges of the pixel electrode 44 can be placed to overlapping the scanning lines 42 and the signal lines 43, increasing the area of the pixel electrode 44 and achieving a high aperture ratio.

As shown in FIGS. 7 and 9, the pixel electrode 44 is connected to the drain electrode 57 of the TFT 45 by the contact of the pixel electrode 44 to a supplemental capacitance electrode (Cs electrode) 61 via a through hole 62 in the interlayer insulating film 58 above the Cs line 46. The Cs electrode 61 is composed of a transparent conductive film T that is the lower layer of the drain electrode 57 of a double-layered structure, and connected to the drain electrode 57 via a connecting electrode 60 also composed of a transparent conductive film T. A supplemental capacitance is formed where the Cs electrode 61 overlaps the Cs line 46 provided to the lower layer with the gate insulating film 52 disposed between the Cs electrode 61 and the Cs line 46.

The Pixel on Passivation structure is disclosed, for example, by Japanese Laid-Open Patent Application No. 172685/1983 (Tokukaisho 58-172685). It is known that the structure improves the aperture ratio and restrains defective orientation of the liquid crystal by shielding the electric field generated by the signal lines.

However, a simple adoption of the Pixel on Passivation structure to the liquid crystal display element for better display quality brings the opposite result. The Pixel on Passivation structure generates a larger parasitic capacitance between the scanning line 42 and the pixel electrode 44 than does the conventional structure shown in FIG. 5, and consequently the pixel voltage applied to the pixel electrode 44 is affected by the source signal in the scanning line 42 and causes crosstalk, degrading the display quality.

A suggested method for a reduced parasitic capacitance is to use as the interlayer insulating film 58 an organic insulating film that has a relatively low dielectric constant and can be easily made into a thick film.

As the active matrix substrate has increasingly fine and delicate structure, a reduction in the ON resistance of the TFT 45 as a switching element is desired. A proposed solution to this is to use a fine crystal silicon (n$^+$) film in place of a conventionally used amorphous silicon (n$^+$) film as the contact layer 55 which is a doped semiconductor layer.

However, when a TFT 45, as the switching element, having a fine crystal silicon (n$^+$) film as the contact layer 55 is used in combination with the interlayer insulating film 58 as the organic insulating film, an increase in OFF current is observed in an area where gate voltage is negative, especially in an area where a deep voltage not more than −10 V is applied, due to hole current between the grains of the fine crystal silicon (n$^+$) film. Such an increase in OFF current limits the voltage at which the TFT 45 as a switching element can be driven, reduces the margin of threshold shift caused by aging, and offers less freedom in designing active matrix substrates.

In order to circumvent the reduction in OFF current, it has been suggested that an inorganic insulating film such as SiNx should be formed beneath the organic insulating film. This method, however, requires a process covering the formation of the inorganic insulating film to the photo-etching thereof, inevitably resulting in an increased number of processes. Consequently, another method with no additional process is desired.

SUMMARY OF THE INVENTION

In order to work out the problems noted with conventional devices, an active matrix substrate in accordance with the present invention includes:

- a thin film transistor disposed in proximity of a cross point of a scanning line and a signal line;
- an interlayer insulating film disposed so as to cover the thin film transistor, the scanning line, and the signal line; and
- a pixel electrode disposed on the interlayer insulating film.

The interlayer insulating film is composed of an organic insulating film, and

- a contact layer of the thin film transistor is made up of two layers of fine crystal silicon (n$^+$) and amorphous silicon (n$^+$), the fine crystal silicon (n$^+$) layer being placed closer to a source electrode and a drain electrode than is the amorphous silicon (n$^+$) layer.

With this arrangement, first, since the interlayer insulating film is composed of an organic insulating film, the parasitic capacitance is reduced between the pixel electrode and the signal line. Consequently, no crosstalk occurs and good display quality is obtained.

Secondly, since the contact layer of the thin film transistor is constituted by two layers, i.e. a fine crystal silicon (n$^+$) layer and an amorphous silicon (n$^+$) layer, the fine crystal silicon (n$^+$) layer being placed closer to the source and drain electrodes of the thin film transistor than is the amorphous silicon (n$^+$) layer, the fine crystal silicon (n$^+$) layer renders the ON resistance of the thin film transistor low, and the amorphous silicon (n$^+$) layer restrains increases in the OFF current.

Additionally, since the amorphous silicon (n$^+$) layer and the fine crystal silicon (n$^+$) layer can be formed with a single device and chamber only by modifying film formation conditions, a new process is not necessary that would significantly add to production costs and decrease productivity.

As a result, both the ON characteristics and the OFF characteristics can be improved with the Pixel on Passivation structure of a high aperture ratio without adding to production costs or decreasing productivity. Therefore, it is possible to expand the stable operative region of the active matrix substrate, the margin to accommodate to variations in threshold value due to aging, and the freedom in designs.

For a fuller understanding of the nature and advantages of the invention, reference should be made to the ensuing detailed description taken in conjunction with the accompanying drawings.

DETAILED DESCRIPTION OF PREFERRED EMBODIMENTS

Referring to FIGS. 1 through 4, the following description will discuss an embodiment in accordance with the present invention.

Figure 1:
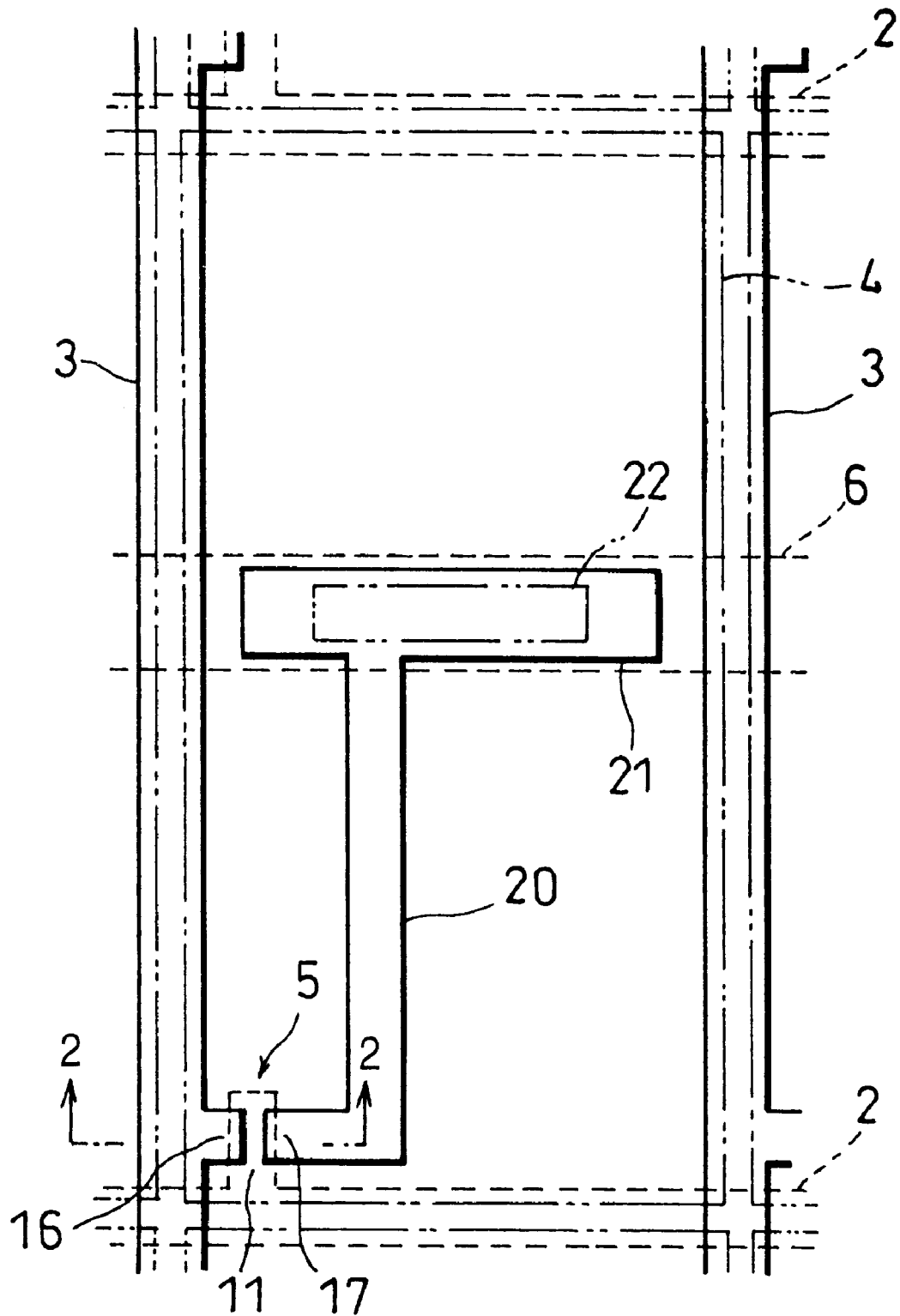
FIG. 1 is a plan view showing a segment, including a pixel, of an active matrix substrate of an embodiment in accordance with the present invention.

FIG. 1 is a plan view showing an active matrix substrate in accordance with the present invention, showing a segment including one of pixels disposed in matrix form.

As shown in FIG. 1, the active matrix substrate has on an insulating substrate 1 scanning lines 2 disposed parallel to one another and signal lines 3 disposed crossing the scanning lines 2 at right angles. The substrate 1 will be later described in detail (see FIG. 2).

Pixel electrodes 4 are disposed in the rectangular regions bordered by the scanning lines 2 and the signal lines 3. TFTs 5 are formed as switching elements in proximity to the cross points of the scanning lines 2 and the signal lines 3.

In addition, between neighboring pairs of the scanning lines 2 beneath the pixel electrodes 4 are formed supplemental capacitance (Cs) lines 6 disposed parallel to the scanning lines 2. The Cs lines 6 are provided common to all the pixels. A supplemental capacitance is formed where the pixel electrode 4 overlaps the Cs line 6 with a gate insulating film 12 therebetween.

Figure 2:
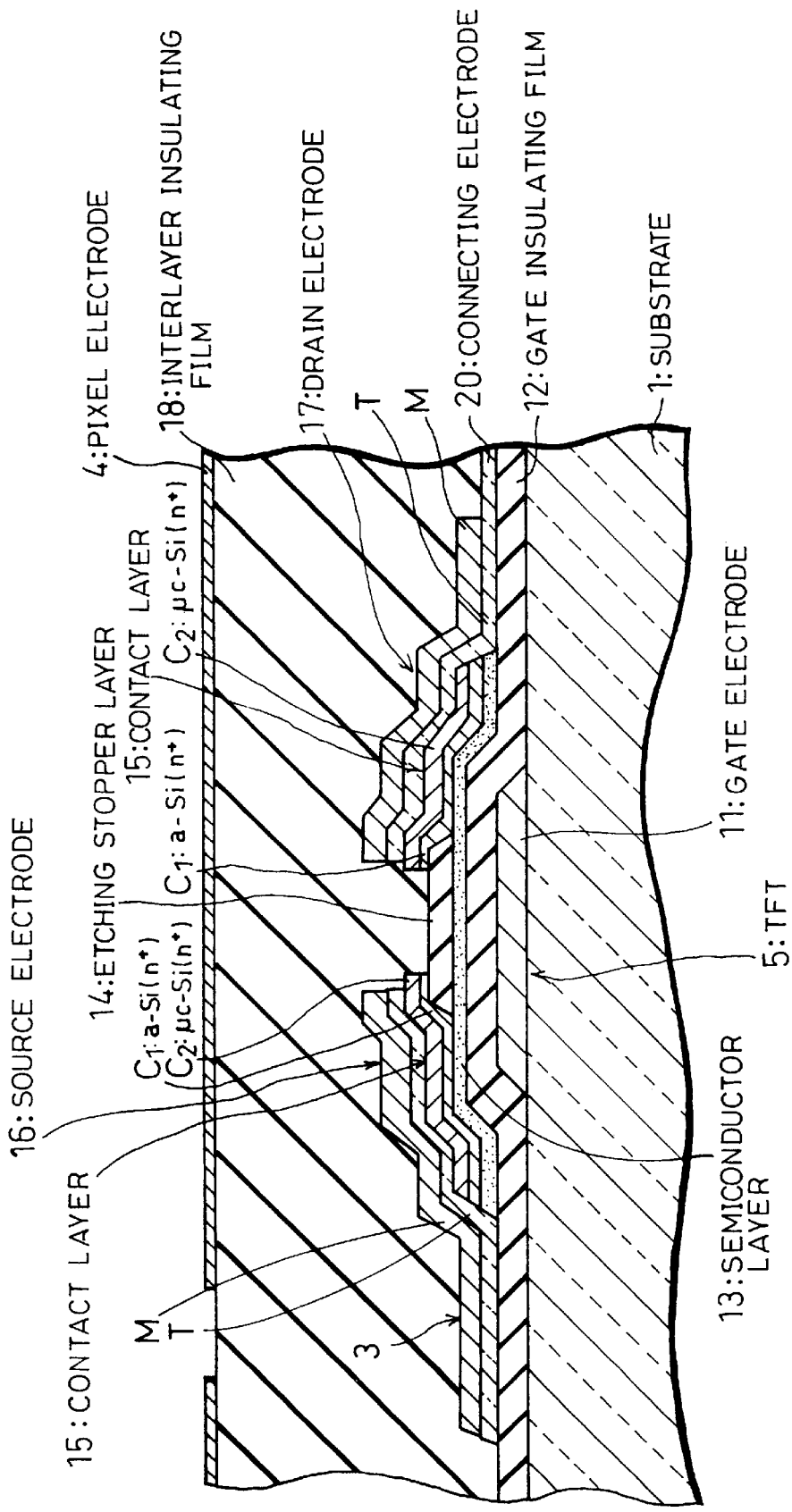
FIG. 2 is a cross-sectional view taken along line 2—2 in FIG. 1, showing the structure of the TFT incorporated in the active matrix substrate in FIG. 1.

The TFT 5 has an etching stopper layer 14 as shown in FIG. 2 which is a cross-sectional view taken along line 2—2 in FIG. 1, and is of a channel protect type of a reverse stagger design in which the gate electrodes 11 are formed on the substrate 1. The etching stopper layer 14 will be later described in detail.

Therefore, the TFT 5 has a layered structure including the gate electrode 11, the gate insulating film 12, a semiconductor layer 13, a contact layer 15, a source electrode 16, and a drain electrode 17 formed on the substrate 1 in this order.

A detailed description of a manufacturing process of such an active matrix substrate is given below with reference to FIGS. 1 and 2.

First, the substrate 1 composed of transparent insulating glass is coated by sputtering with a Ta film having a thickness of 3000 Å, subjected to patterning by photo lithography, and then etched to form the scanning lines 2, the gate electrodes 11, and the Cs lines 6.

The Ta film can be etched by dry etching using a plasma mixed gas of $CF_4$ and $O_2$ or by wet etching using a mixed liquid of hydrofluoric acid and nitrate acid as the etching liquid. As to wet etching, $Ta_2O_5$ having a thickness of 1000 Å to 10000 Å needs to be formed in advance between the substrate 1 and the Ta film to prevent the substrate 1 from being etched.

The present embodiment employs dry etching. Although Ta is used as the gate material, Al, Mo or an alloy thereof may be used instead.

Moreover, to enhance insulation, the surfaces of the scanning lines 2, the gate electrodes 11, and the Cs lines 6 may be subjected to anodic oxidation prior to the formation of the gate insulating film 12 by plasma CVD, so as to form $Ta_2O_5$ having a thickness of 3000 Å.

A first SiNx film, an a-Si(i) film, and a second SiNx film are formed one after another by plasma CVD. The first SiNx film is formed in a thickness of 3000 Å to act as the gate insulating film 12. The a-Si(i) film is formed in a thickness of 300 Å to act as the semiconductor layer 13. The second SiNx film is formed in a thickness of 2000 Å to act as the etching stopper layer 14. Thereafter, the formed films are patterned by photo lithography, and the SiNx film at the top is etched by BHF liquid (hydrofluoric acid and ammonium fluoride) to form only the etching stopper layer 14.

Subsequently, an $n^+$ semiconductor layer is formed that acts as the contact layer 15. Here, a double layer structure made up of a fine crystal silicon ($n^+$) layer $C_2$ and an amorphous silicon ($n^+$) layer $C_1$ is used. Hereinafter, the fine crystal silicon ($n^+$) will be referred to as $\mu c$-Si ($n^+$), and the amorphous silicon ($n^+$) as a-Si ($n^+$).

The a-Si ($n^+$) layer $C_1$ and the $\mu c$-Si ($n^+$) layer $C_2$ are formed one after another with thicknesses of 10 nm and 40 nm respectively by plasma CVD, and patterned by photo lithography. The $\mu c$-Si ($n^+$) layer $C_2$, the a-Si ($n^+$) layer $C_1$, and the a-Si(i) layer which is the semiconductor layer 13 are etched all together by dry etching using HCl and an $SF_6$ gas. The a-Si ($n^+$) layer $C_1$ and the $\mu c$-Si ($n^+$) layer $C_2$ can be formed with a single device and chamber only by modifying film formation conditions. Thus, a new process is not necessary that would add to production costs and decrease the productivity.

The effects of the a-Si ($n^+$) layer $C_1$ become evident when it is thicker than about 5 nm. The $\mu c$-Si ($n^+$) layer $C_2$ preferably has a thickness of 20 nm or more, since a complete fine crystal silicon film hardly grows out of a $\mu c$-Si ($n^+$) layer $C_2$ having a thickness of 10 nm or less.

Next, a contact hole (not shown) is formed on a terminal by etching the gate insulating film 12 composed of SiNx.

The contact hole acts as a connecting portion of a driver IC and bus lines that are the scanning lines 2 and the signal lines 3.

Next, either a single layer made of one of the materials, ITO (Indium Tin Oxide), $SnO_2$, and $InO_3$ or a plural layer film made of two or more of those materials is applied with a thickness of 300 to 3000 Å by sputtering to form the transparent conductive film T. On the transparent conductive film T, either a single layer made of one of the materials, Ti, Ta, TaN, Mo, and Al or a plural layer film made of two or more of those materials are applied with a thickness of 500 to 5000 Å by sputtering to form the metal thin film M. Thereafter, the metal thin film M is patterned by photo lithography and then etched to form the source electrodes 16, the drain electrodes 17, and the signal lines 3.

The present embodiment employs ITO having a thickness of 1500 Å as the transparent conductive film T, and Ta having a thickness of 3000 Å as the metal thin film M. The metal thin film M is etched by dry etching using a fluorine mixed gas such as $CF_4$ and $O_2$ gas as the etching gas.

In this process, since the transparent conductive film T and the metal thin film M yield a good etching rate selection ratio, the gate insulating film 12, a bed made of SiNx, is not etched.

Subsequently, the transparent conductive film T is patterned by photo lithography, and then etched to form connecting electrodes 20 and Cs electrodes 21.

The transparent conductive film T is etched by wet etching using a ferric chloride etching liquid that is a mixed liquid of HCl and an $FeC_{13}$. Here the pattern is preferably made so that a resist pattern remains on the signal lines 3 as a precaution to a possible cut-off of the signal lines 3.

A 3 $\mu$m thick film is formed of a photosensitive acrylic resin as the interlayer insulating film 18 by, for example, spin coating.

Next, the acrylic resin is exposed with a desired pattern, and treated with an alkaline solution. Hence only the exposed portion is etched by the alkaline solution to form a contact hole 22 piercing through the interlayer insulating film 18. As a result of patterning by such alkaline development, the contact hole 22 has a good taper shape.

The use of a photosensitive acrylic resin as the interlayer insulating film 18 is advantageous in productivity. For example, since the film can be formed by spin coating, it becomes easier to form a film as thin as a few $\mu$m, and the patterning does not require a process for applying photo resist.

Although the acrylic resin used in the present embodiment is colored before application, it can be made transparent by performing exposure treatment to the entire surface thereof after patterning. Such treatment can be performed chemically too, which is also effective.

The present embodiment employs an acrylic organic resin as the interlayer insulating film 18. However, other insulating materials such as polyimide may be used.

Moreover, a transparent conductive film as the pixel electrodes 4 is formed by sputtering and then patterned. The pixel electrode 4 is connected to the Cs electrode 21 composed of ITO as mentioned earlier via the contact hole 22 piercing through the interlayer insulating film 18.

This completes the manufacture of the active matrix substrate having the aforementioned structure.

It is assumed in the present embodiment that the active matrix substrate is incorporated in a TFT-LCD of a transparent type. However, the transparency of the organic insulating film as the interlayer insulating film 18 is not essential when it is incorporated in a reflection type. In such a case, a conductive film with high reflectance, such as Al, that acts as a reflector plate is used instead of ITO as the pixel electrodes 4.

Figure 3:
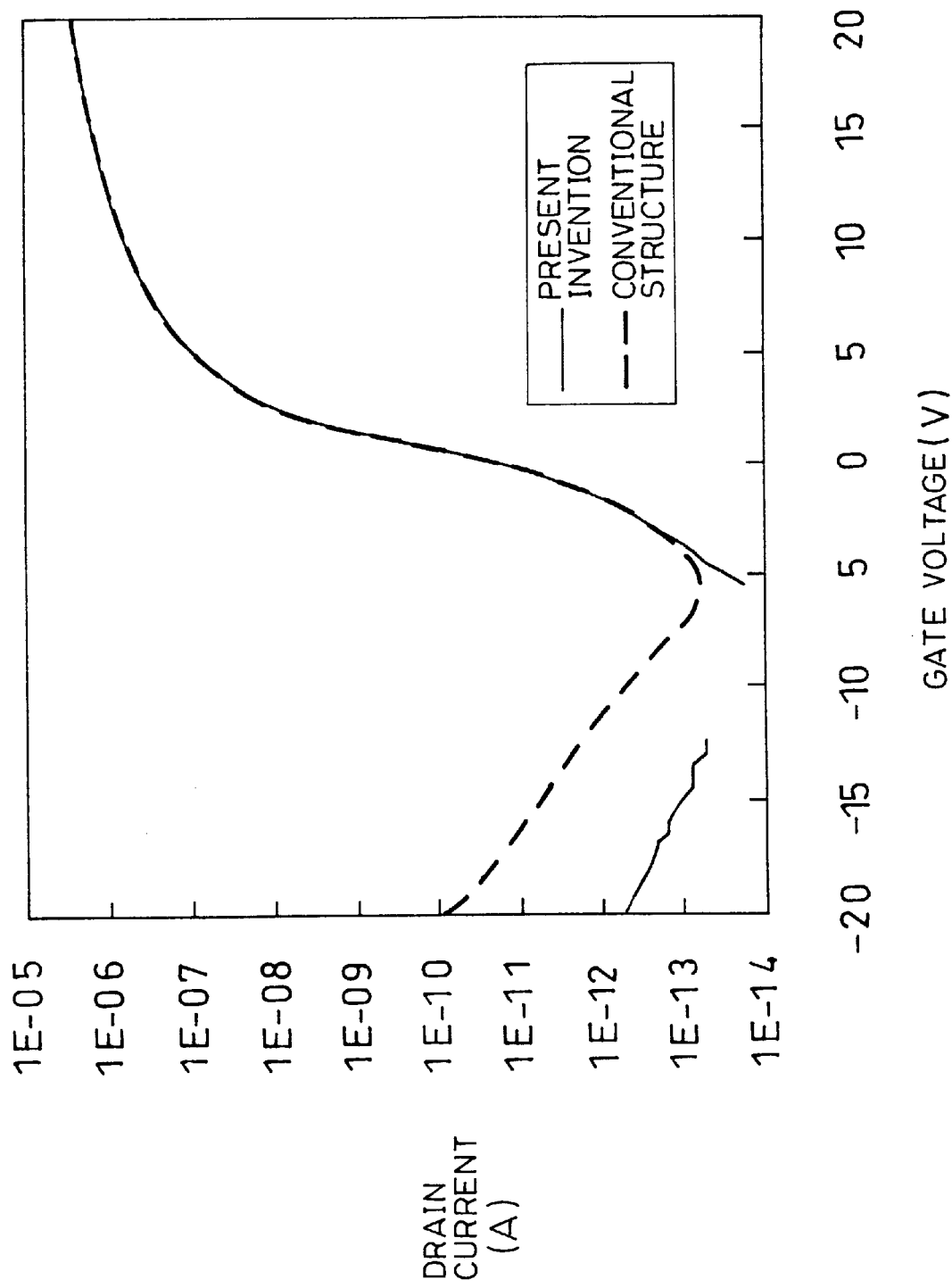
FIG. 3 is a graph showing electrical characteristics of the TFT incorporated in an exemplary active matrix substrate of the embodiment.

FIG. 3 shows electrical characteristics of the TFT 5 incorporated in an exemplary active matrix substrate manufactured by the process above. Also shown as a comparative example are electrical characteristics of a TFT incorporated in an active matrix substrate of a conventional structure where an organic insulating film is used for the interlayer insulating film 18, but the contact layer 15 of the TFT is composed only of $\mu$c-Si (n$^+$).

As can be seen from the graph, in a range where the gate voltage applied to the gate electrode 11 is deeper than −10 V, although being in an OFF state, the active matrix substrate of a conventional structure increases the drain current and deteriorates the OFF characteristics. By contrast, as to the structure of the present invention, the drain current stays at about 0.1 pA (less than measurable) to about −20 V, which is an indication of stable OFF characteristics. In addition, in a range where the gate voltage is positive, the two structures do not differ in general and in the ON characteristics in particular.

As detailed so far, the active matrix substrate has an organic insulating film as the interlayer insulating film 18 and two layers including the a-Si (n$^+$) layer $C_1$ and the $\mu$c-Si (n$^+$) layer $C_2$ as the contact layer 15 of the TFT 5, the $\mu$c-Si (n$^+$) layer $C_2$ being placed closer to the source electrode 16 and the drain electrode 17 than is the a-Si (n$^+$) layer $C_1$.

Accordingly, first, since the interlayer insulating film 18 is composed of an organic insulating film, the parasitic capacitance is reduced between the pixel electrode 4 and the signal line 3. Consequently, no crosstalk occurs and good display quality is obtained despite the high aperture ratio.

Secondly, since the contact layer 15 of the TFT 5 is composed of two layers of the a-Si (n$^+$) layer $C_1$ and the $\mu$c-Si (n$^+$) layer $C_2$ with the $\mu$c-Si (n$^+$) layer $C_2$ being placed closer to the source electrode 16 and the drain electrode 17 than is the a-Si (n$^+$) layer $C_1$, the $\mu$c-Si (n$^+$) layer $C_2$ connected to the source electrode 16 and the drain electrode 17 renders the ON resistance of the thin film transistor low, and the a-Si (n$^+$) layer $C_1$ restrains increases in the OFF current that flows when the TFT 5 is turned OFF.

In such a case, since the a-Si (n$^+$) layer $C_1$ and the $\mu$c-Si (n$^+$) layer $C_2$ can be formed with a single device and chamber only by modifying film formation conditions, a new process is not necessary that would add to the production costs by a large amount and decrease the productivity.

As a result, both the ON characteristics and the OFF characteristics of the TFT can be improved with the Pixel on Passivation structure of a high aperture ratio without adding to production costs or decreasing productivity. Therefore, it is possible to expand the stable operative region of the active matrix substrate, the margin to accommodate to variations in threshold value due to aging, and the freedom in designs.

Moreover, since in the active matrix substrate, the $\mu$c-Si (n$^+$) layer $C_2$ forming the contact layer 15 is set to have a thickness of 20 nm or more, it is ensured that a complete fine crystal silicon (n$^+$) can be obtained and that the ON resistance of the thin film transistor is reduced.

Also, since the a-Si (n$^+$) layer $C_1$ forming the contact layer 15 is set to have a thickness of 5 nm or more, it is ensured that the increase in the OFF current of the thin film transistor is prevented.

Also, since the interlayer insulating film 18 is formed by spin coating using photosensitive acrylic resin, it is easier to form a film as thin as a few $\mu$m, and the patterning does not require a process for applying photo resist, thereby improving productivity.

Figure 4:
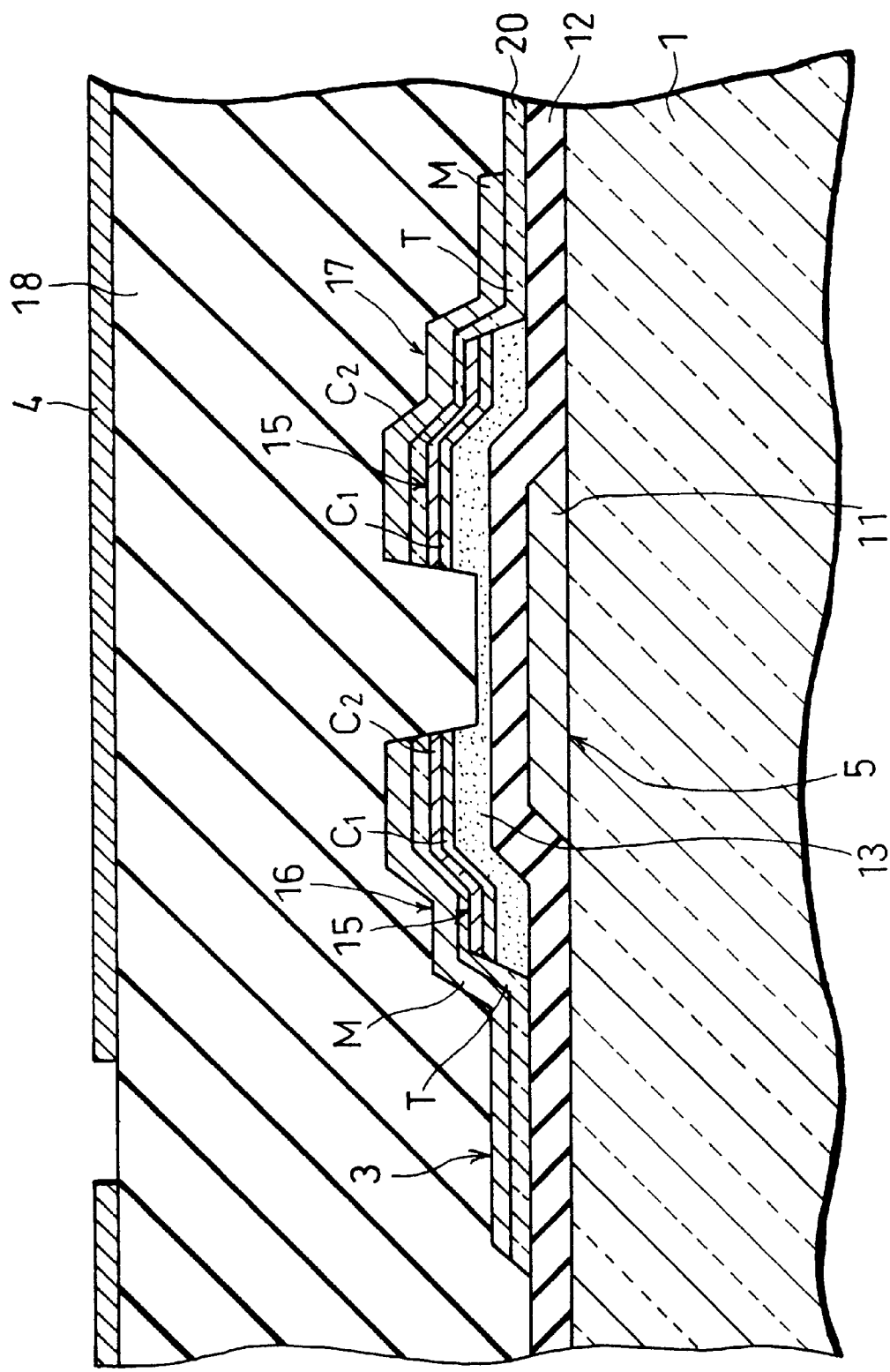
FIG. 4 is a cross-sectional view showing the structure of the TFT incorporated in an active matrix substrate of another embodiment in accordance with the present invention.
Figure 5:
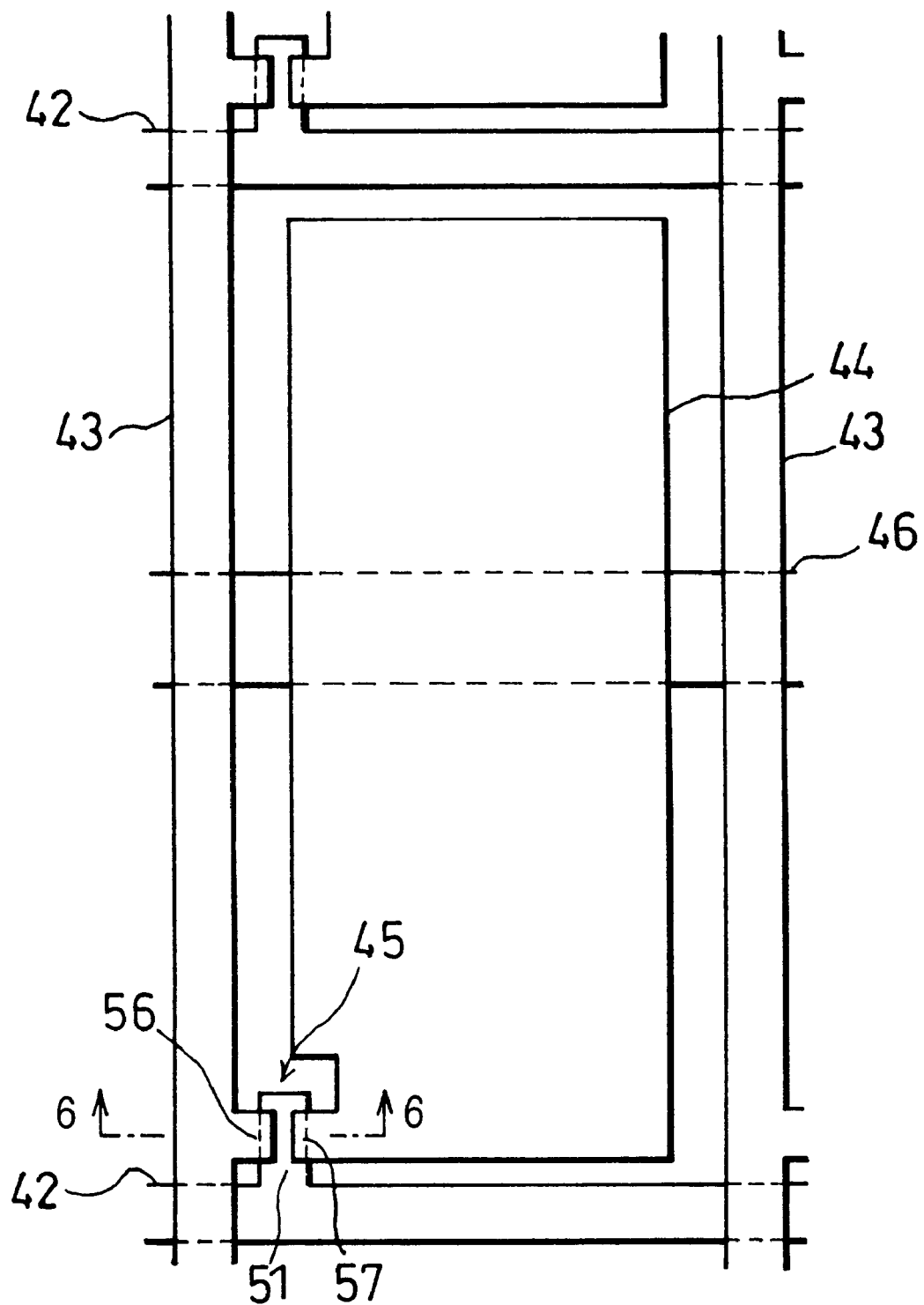
FIG. 5 is a plan view showing a segment, including a pixel, of a conventional active matrix substrate.
Figure 6:
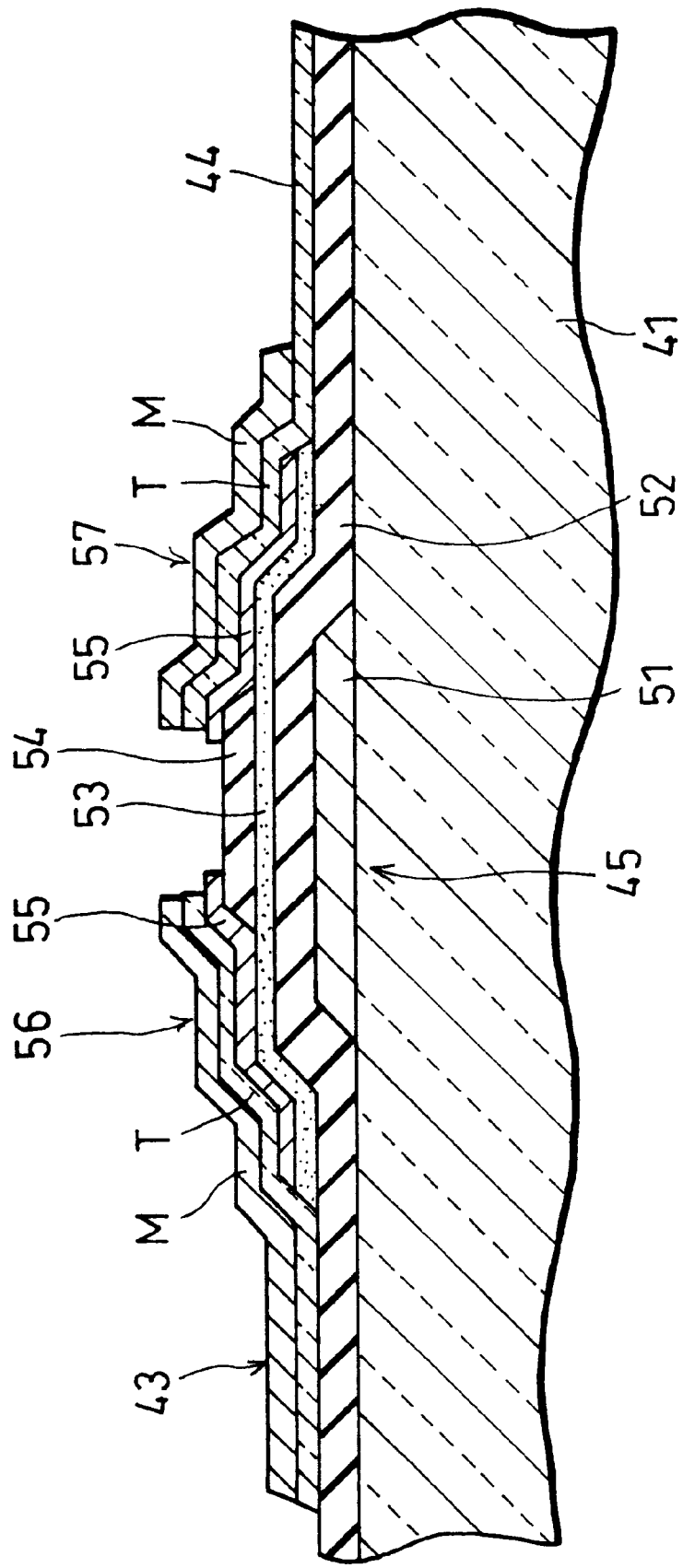
FIG. 6 is a cross-sectional view taken along line 6—6 in FIG. 5, showing the structure of a TFT incorporated in the active matrix substrate in FIG. 5.
Figure 7:
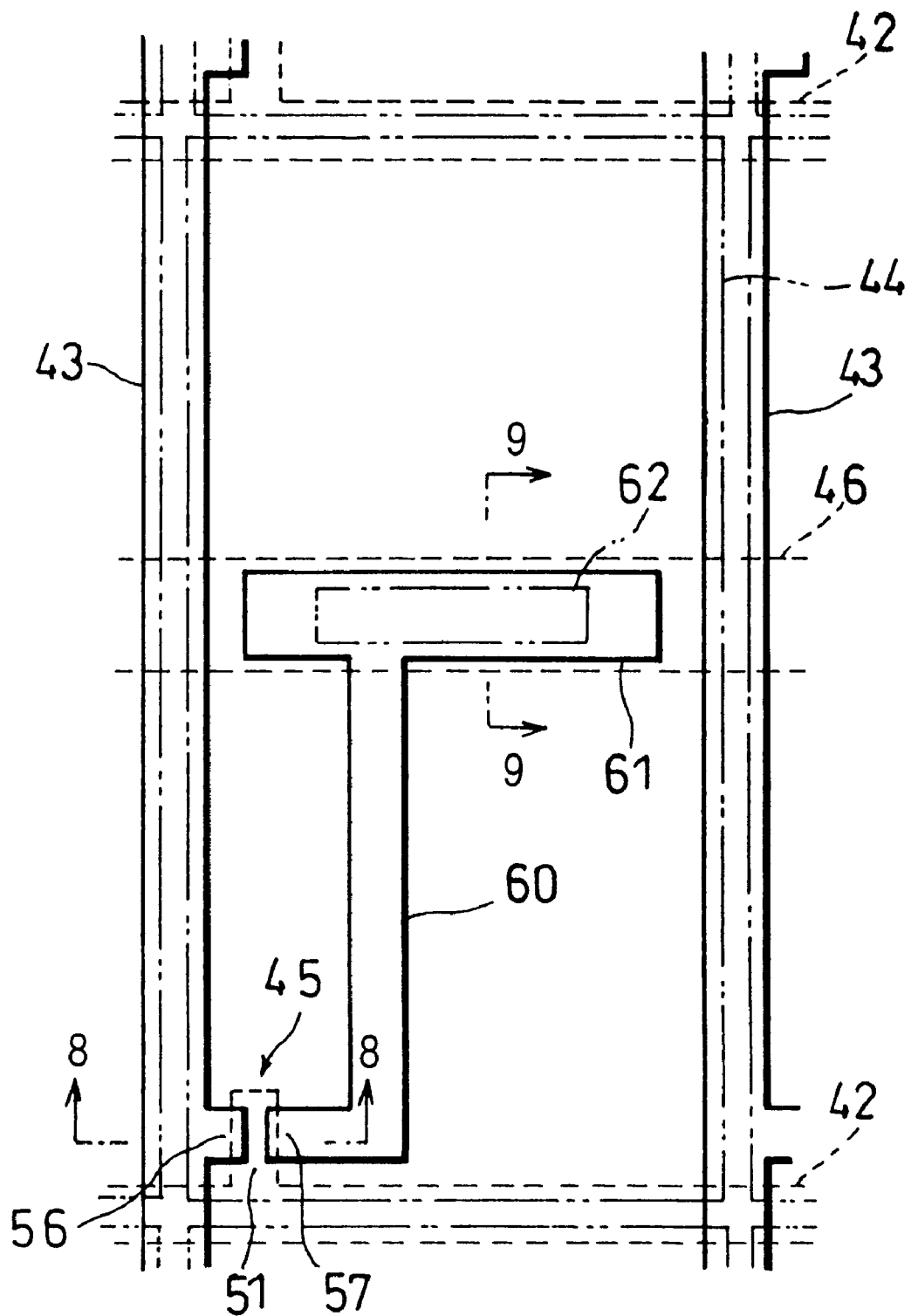
FIG. 7 is a plan view showing a segment, including a pixel, of another conventional active matrix substrate.
Figure 8:
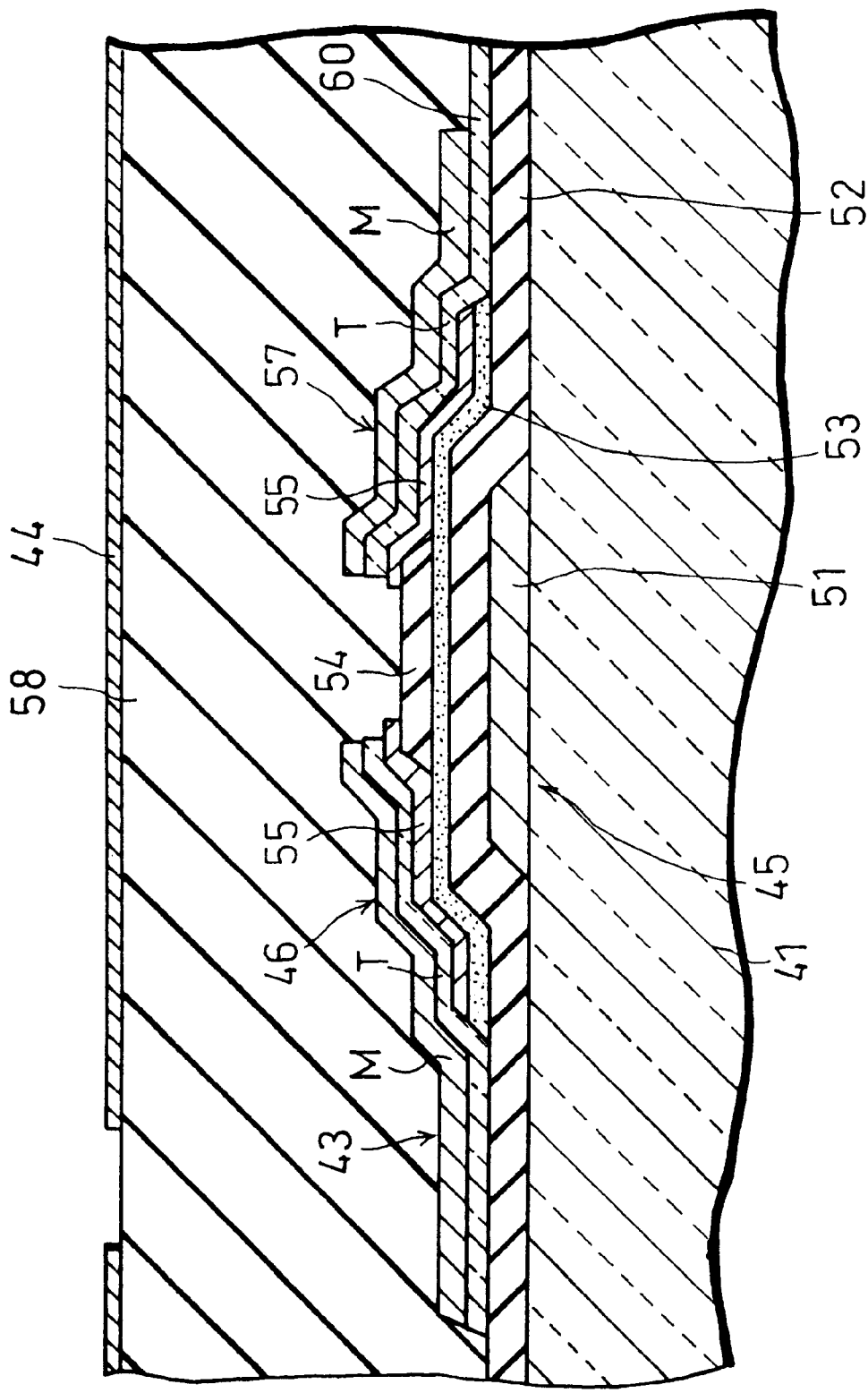
FIG. 8 is a cross-sectional view taken along line 8—8 in FIG. 7, showing the structure of a TFT incorporated in the active matrix substrate in FIG. 7.
Figure 9:
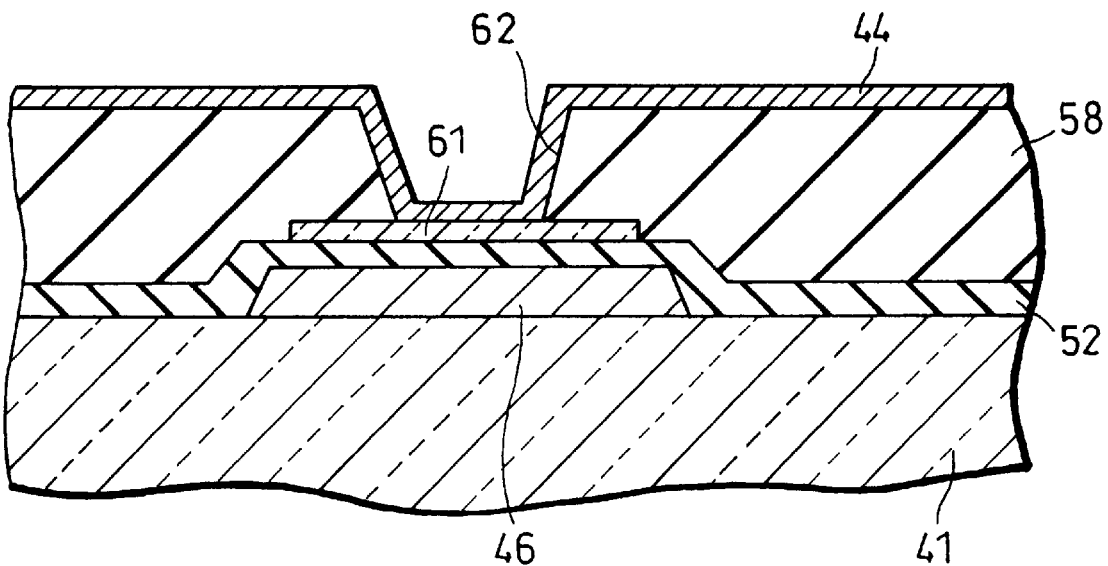
FIG. 9 is a cross-sectional view taken along line 9—9 in FIG. 7, illustrating the connection of a pixel electrode with the drain electrode of the TFT of the active matrix substrate in FIG. 7.

Note that although the present embodiment so far discussed the TFT 5, a channel protect type TFT of a reverse stagger design, incorporated as a switching element, the present invention is not limited to such an arrangement and can be applied to other structures including TFTs of forward stagger designs and those of planar designs. FIG. 4 shows an application of the present invention to a TFT of a channel etch type of a reverse stagger design.

As described so far, an active matrix substrate in accordance with the present invention includes:

an insulating substrate;

a scanning line and a signal line disposed in matrix form on the substrate;

a thin film transistor electrically connected to the scanning line and the signal line;

an interlayer insulating film disposed so as to cover the thin film transistor, the scanning line, and the signal line; and a pixel electrode disposed on the interlayer insulating film and electrically connected to a drain electrode of the thin film transistor via a through hole.

The interlayer insulating film is composed of an organic insulating film, and a contact layer of the thin film transistor is made up of two layers of fine crystal silicon (n$^+$) and amorphous silicon (n$^+$), the fine crystal silicon (n$^+$) layer being placed closer to a source electrode and a drain electrode than is the amorphous silicon (n$^+$) layer.

This permits the interlayer insulating film made up of an organic insulating layer to reduce the parasitic capacitance between the pixel electrode and the signal line, to circumvent crosstalk. Therefore, good display quality is offered.

Since the contact layer is made up of two layers, i.e. fine crystal silicon (n$^+$) on the side closer to the source and drain electrodes of the thin film transistor and amorphous silicon (n$^+$) on the opposite side, the ON resistance can be restrained to be low, and the OFF current can be prevented from increasing. In addition, since the fine crystal silicon (n$^+$) layer and the amorphous silicon (n$^+$) layer can be formed with a single device and chamber only by modifying film formation conditions, a new process is not necessary that would add to the production costs by a large amount and decrease the productivity.

As a result, both the ON characteristics and the OFF characteristics of the thin film transistor can be improved with the Pixel on Passivation structure of a high aperture ratio without adding to the production costs by a large amount or decreasing the productivity. Therefore, it is possible to expand the stable operative region of the active matrix substrate, and the margin to accommodate variations in threshold value due to aging.

With the active matrix substrate of the above arrangement, the fine crystal silicon (n$^+$) layer constituting the contact layer is preferably further arranged to have a thickness of not less than 20 nm.

Since complete fine crystal silicon hardly grows out of a fine crystal silicon (n$^+$) layer having a thickness of 10 nm or less, such a limitation on the thickness of the fine crystal silicon (n$^+$) layer allows fine crystal silicon (n$^+$) to grow completely, and the reduction in the ON resistance of the thin film transistor is ensured.

With the active matrix substrate of any of the above arrangements, the amorphous silicon (n$^+$) layer constituting the contact layer is preferably further arranged to have a thickness of not less than 5 nm.

Since an amorphous silicon ($n^+$) layer having a thickness of less than 5 nm does not produce tangible effects, such a limitation on the thickness of the amorphous silicon ($n^+$) layer ensures the effect of preventing the OFF current of the thin film transistor from increasing.

With the active matrix substrate of any of the above arrangements, the interlayer insulating film is preferably further arranged to be formed using a photosensitive acrylic resin.

This makes it easier to form a film as thin as a few $\mu$m, and eliminates the need in the patterning for a process for applying photo resist, thereby improving productivity.

As described so far, a manufacturing method in accordance with the present invention is for manufacturing an active matrix substrate including:

an interlayer insulating film composed of an organic insulating film and disposed so as to cover a scanning line, a signal line, and a thin film transistor disposed in proximity of a cross point of the scanning line and the signal line; and a pixel electrode disposed on the interlayer insulating film.

The active matrix substrate is arranged so that a contact layer of the thin film transistor is made up of a fine crystal silicon ($n^+$) layer and an amorphous silicon ($n^+$) layer with a single device and a single chamber by changing film forming conditions, and the fine crystal silicon ($n^+$) layer is formed to be closer to a source electrode and a drain electrode of the thin film transistor than is the amorphous silicon ($n^+$) layer.

This arrangement enables a single device and a single chamber to form the fine crystal silicon ($n^+$) layer and the amorphous silicon ($n^+$) layer only by changing film forming conditions. Consequently, the electrical characteristics of an active matrix substrate can be improved without a new process that would add to production costs and decrease the productivity.

If the fine crystal silicon ($n^+$) layer is formed to have a thickness of not less than 20 nm in the manufacturing method, the electrical characteristics of an active matrix substrate can be further improved.

If the amorphous silicon ($n^+$) layer is formed to have a thickness of not less than 5 nm in the manufacturing method, the electrical characteristics of an active matrix substrate can be further improved.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An active matrix substrate, comprising:
 a thin film transistor disposed in proximity of a cross point of a scanning line and a signal line;
 an interlayer insulating film disposed covering the thin film transistor, the scanning line, and the signal line; and
 a pixel electrode disposed on the interlayer insulating film, wherein the interlayer insulating film is composed of an organic insulating film, and wherein a contact layer formed of source and drain regions of said transistor is made up of two layers of fine crystal silicon ($n^+$) and amorphous silicon ($n^+$), the fine crystal silicon ($n^+$) layer being placed closer to a source electrode and a drain electrode than the amorphous silicon ($n^+$) layer.

2. The active matrix substrate as defined in claim 1, wherein the fine crystal silicon ($n^+$) layer has a thickness of not less than 20 nm.

3. The active matrix substrate as defined in claim 1, wherein the amorphous silicon ($n^+$) layer has a thickness of not less than 5 nm.

4. The active matrix substrate as defined in claim 2, wherein the amorphous silicon ($n^+$) layer has a thickness of not less than 5 nm.

5. The active matrix substrate as defined in claim 1, wherein the interlayer insulating film is formed of a photosensitive acrylic resin.

* * * * *